(12) United States Patent
Kavadias

(10) Patent No.: US 6,909,292 B1
(45) Date of Patent: Jun. 21, 2005

(54) METHOD FOR SUPPRESSING EVEN ORDER HARMONICS IN A DEVICE THAT UTILIZES TRANSCONDUCTORS

(75) Inventor: Spyros Kavadias, Athens (GR)

(73) Assignee: Athena Semiconductors, Inc., Fremont, CA (US)

( * ) Notice: Subject to any disclaimer, the term of this patent is extended or adjusted under 35 U.S.C. 154(b) by 0 days.

(21) Appl. No.: 10/621,767

(22) Filed: Jul. 16, 2003

Related U.S. Application Data
(60) Provisional application No. 60/396,495, filed on Jul. 17, 2002.

(51) Int. Cl.[7] .............................................. C01R 27/00
(52) U.S. Cl. ....................................... 324/601; 324/623
(58) Field of Search ................................ 324/601, 620, 324/623; 331/57; 327/65

(56) References Cited

U.S. PATENT DOCUMENTS 4,344,029 A * 8/1982 Cabot et al. ................ 324/624
6,137,370 A * 10/2000 Yamamoto .................... 331/57
2001/0005151 A1 * 6/2001 Suematsu et al. ............. 327/65
2002/0160740 A1 * 10/2002 Hatcher et al. ............. 455/317

* cited by examiner

Primary Examiner—Vincent Q. Nguyen
(74) Attorney, Agent, or Firm—Sawyer Law Group LLP

(57) ABSTRACT

A method for calibrating a low pass filter is disclosed. The low pass filter comprises a plurality of transconductor cells. The method comprises generating a test signal to the low pass filter and suppressing even-order harmonics due to transistor mismatches within the plurality of transconductor cells. By adding a small number of transistors, the mismatch-induced even order harmonics can be greatly reduced. Even-order harmonics are minimized through the application of a control voltage. A method for calibrating against transistor mismatch utilizing a CMOS transconductor that is based on the regulated cascode topology is disclosed. The method is designed to provide suppression of the even-order harmonics, a very small increase in power and a silicon area of the transconductor cell. A well-defined offset is provided by biasing one of the mismatched transistors.

8 Claims, 4 Drawing Sheets

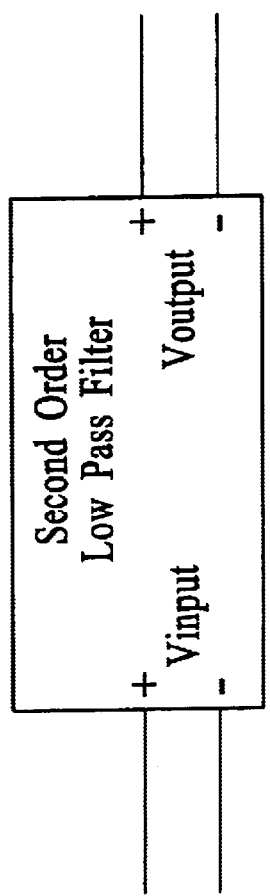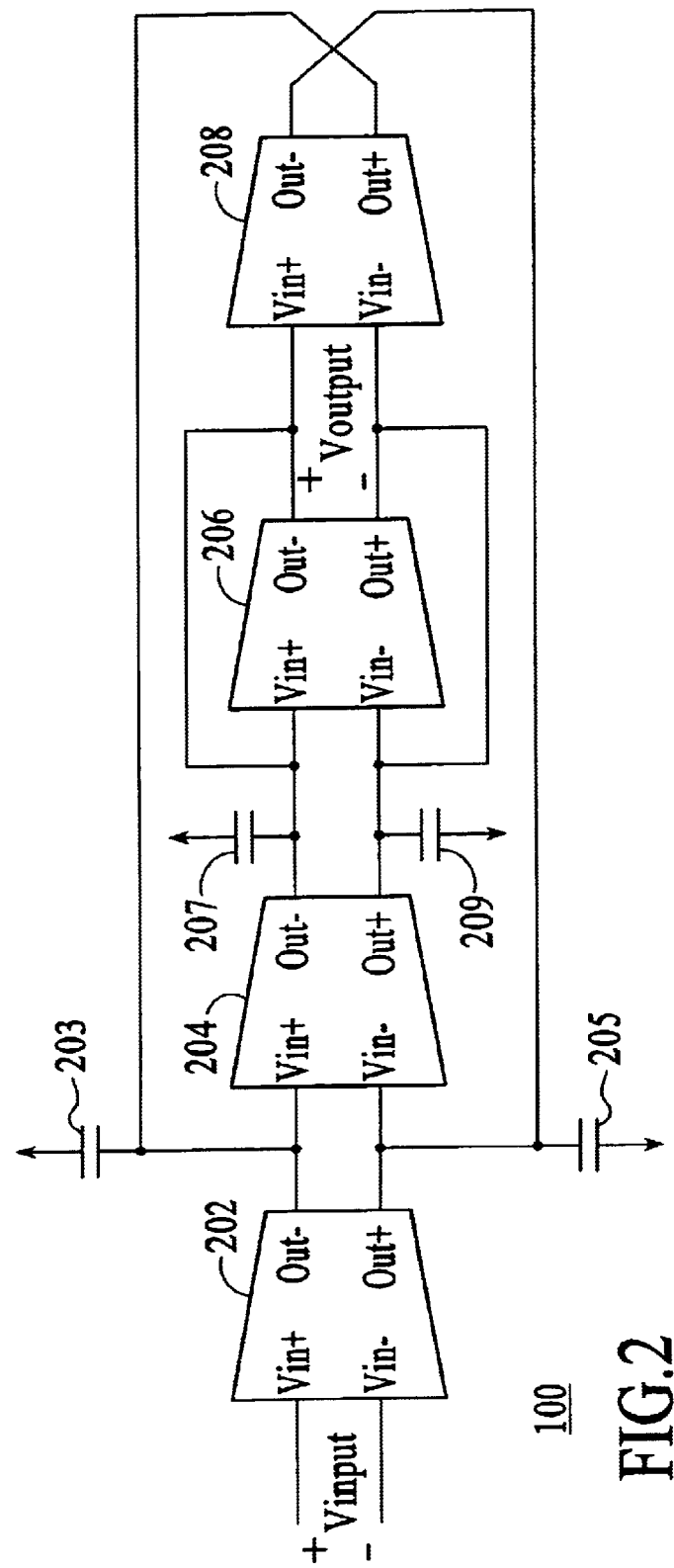

202'

300

METHOD FOR SUPPRESSING EVEN ORDER HARMONICS IN A DEVICE THAT UTILIZES TRANSCONDUCTORS

This application claims priority of U.S. Provisional Patent Application No. 60/396,495 filed Jul. 17, 2002 entitled METHOD FOR CALIBRATING CMOS TRANSCONDUCTORS AGAINST TRANSISTOR MISMATCH.

FIELD OF THE INVENTION

The present invention relates generally to a device that utilizes transconductors and more particularly to a method and system for suppressing even order harmonics in such a device.

BACKGROUND OF THE INVENTION

CMOS transconductors are utilized to provide output currents based upon voltage inputs. One of the uses of the CMOS transconductor is to provide a second order GM-C low pass filter. However, it is well known that even-order harmonics need to be suppressed to ensure proper operation of the low pass filter. What is needed therefore is a system and method for providing a CMOS transconductor which can be utilized in devices in a manner that even order harmonics are minimized.

Accordingly, what is needed is a system and method for minimizing the even-order harmonics which is cost effective, easy to implement and compatible with existing cascode transconductor circuits. The present invention addresses such a need.

SUMMARY OF THE INVENTION

A method for calibrating a device is disclosed. The device comprises a plurality of transconductor cells. The method comprises generating a test signal to the device and suppressing even-order harmonics due to transistor mismatches within the plurality of transconductor cells.

By adding a small number of transistors on the transconductor the mismatch-induced even order harmonics can be greatly reduced. Even-order harmonics are minimized through the application of a control voltage. A method for calibrating against transistor mismatch utilizing a CMOS transconductor that is based on the regulated cascode topology is disclosed. The method is designed to provide suppression of the even-order harmonics, a very small increase in power and a silicon area of the transconductor cell. A well-defined offset is provided by biasing one of the mismatched transistors.

BRIEF DESCRIPTION OF THE DRAWINGS

FIG. 1 is a simple block diagram of a second order low pass filter.

FIG. 2 illustrates a plurality of transconductors to implement the GM-C second order low pass filter.

DETAILED DESCRIPTION

Figure 3:
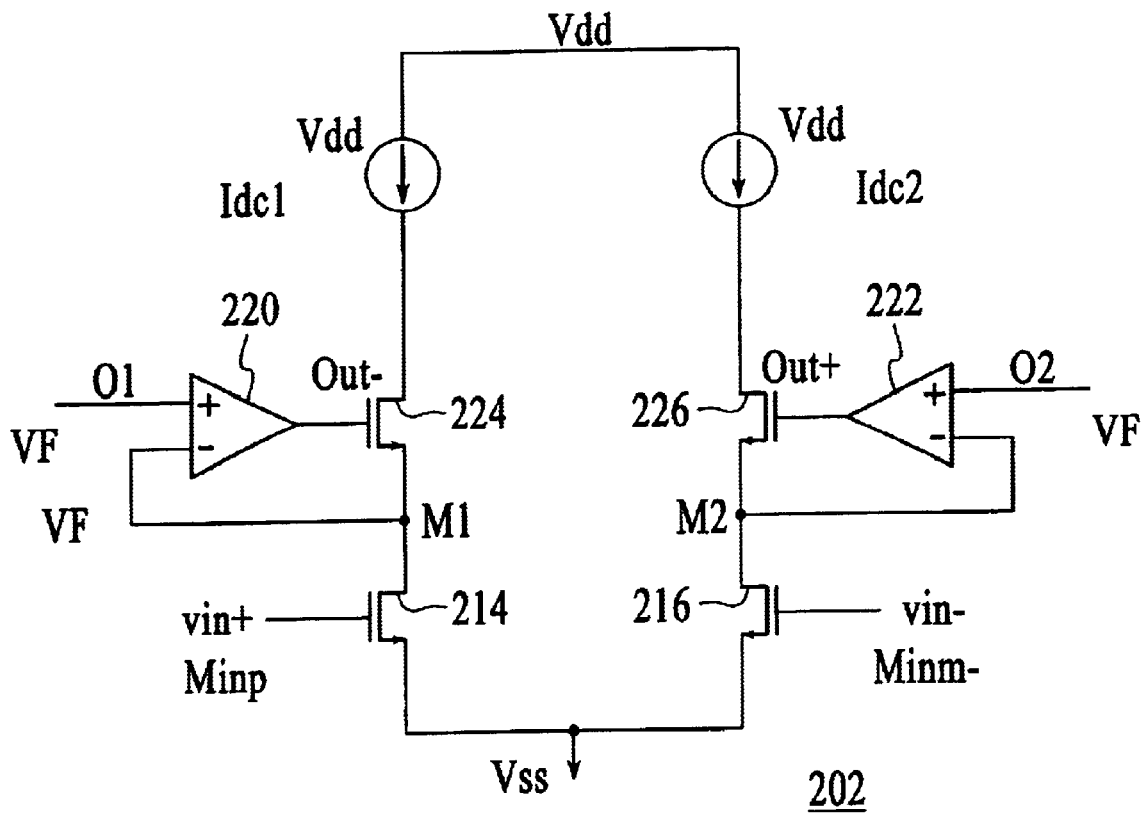
FIG. 3 illustrates the schematic of a conventional cascode transconductor.

The present invention relates generally to a device that utilizes transconductors and more particularly to a method and system for suppressing even order harmonics in such a device. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

In implementing second order low pass filters or other applications, even order harmonics are introduced that affect the performance of the filters. To describe this problem in more detail, refer now to the following.

FIG. 1 is a simple block diagram of a second order low pass filter 100. In this type of filter, differential signals are provided to the input and the signals are filtered to provide a differential output Typically, the low pass filter 100 is implemented utilizing a plurality of transconductors. As before mentioned, in this type of low pass filter even order harmonics affect its performance.

FIG. 2 illustrates a plurality of transconductors coupled to implement the GM-C second order low pass filter. As is seen, transconductor 202 receives differential input signals. The output signals from transconductor 202 are coupled to the inputs of transconductors 204. Capacitors 203 and 205 are also coupled to respective differential inputs of the transconductor 204. The outputs from transconductors 204 are provided to the inputs of transconductors 206. Capacitors 207 and 209 are coupled to respective inputs of transconductor 206. The outputs of transconductor 206 are coupled to the input of transconductor 208. The outputs of transconductor 208 are coupled in feedback relationship respectively to capacitors 203 and 205. In this implementation of the filter 100 the performance is affected due to even order harmonics being introduced based upon the transconductor. To describe this issue in more detail, refer now to the following.

FIG. 3 illustrates the schematic of a conventional cascode transconductor 202'. In this embodiment, transistors 214 and 216 are the input devices, while amplifiers 220 and 222 together with the action of transistors 224 and 226 regulate the drain to source voltage of the input transistors 214 and 216 by keeping it equal to a predetermined volume. In this way, the transconductance is controlled by the volume. Assuming identical transistors 214 and 216, the circuit is balanced and even-order harmonics due to non-linearities are greatly suppressed. However, a mismatch between transistors 214 and 216 is inevitable due to fabrication imperfections. This gives rise to unwanted even order distortion and the circuit is not balanced. This is due to the introduction of an offset voltage in the transconductor. In the presence of this offset the output currents of a transconductor are non-zero when both input voltages are equal.

Figure 4:
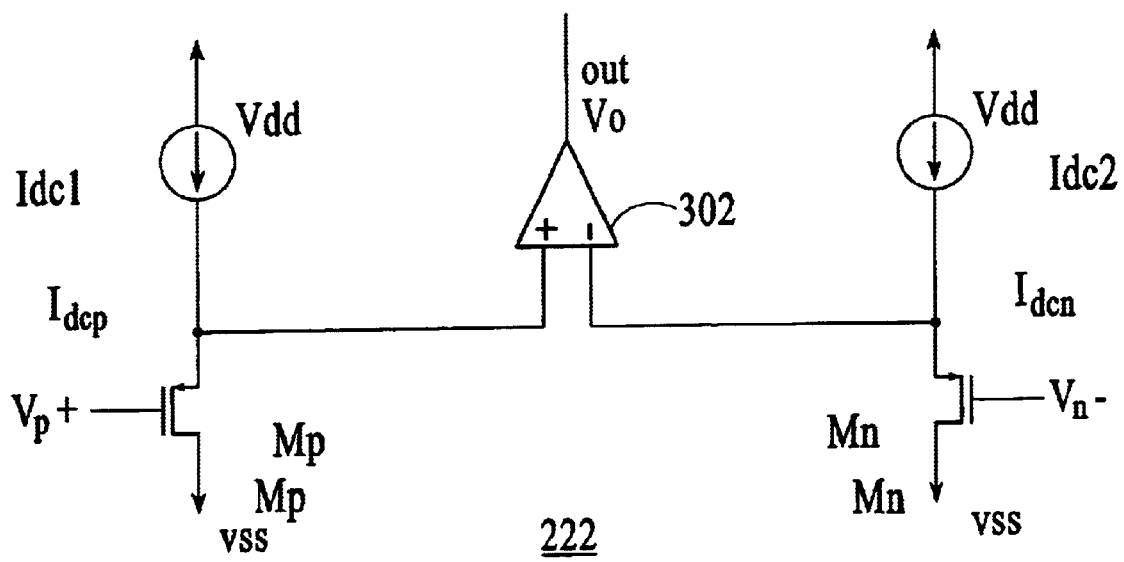
FIG. 4 illustrates an implementation of the operational amplifier used in FIG. 3.

An implementation of the amplifier 222 is shown in FIG. 4. In FIG. 4, the amplifier 302 is illustrated and the inputs (Vn and Vp) are level shifted with the action of the source followers biased with Idc1 and Idc2. Transistor Mp with the current source Idc1 and transistor Mn together with the current source Idc2 are the two source followers. This level shift depends on the current of the source followers. Applicant has discovered that the transconductor offset due to transistor mismatch can be minimized by adjusting the relative magnitude of the two currents of the source followers to the input transistors. When those two currents are equal, the offset of the transconductor depends on the transistor mismatch. By adjusting their relative magnitude, the transconductor offset is minimized. In a preferred embodiment, only one of the two current sources is controlled. Depending on the relative magnitude of currents (Idc1 and Idc2), the induced offset is either positive or negative. By adjusting the magnitude of the current source, the even order harmonics are minimized when the transconductor offset is minimized.

Figure 5:
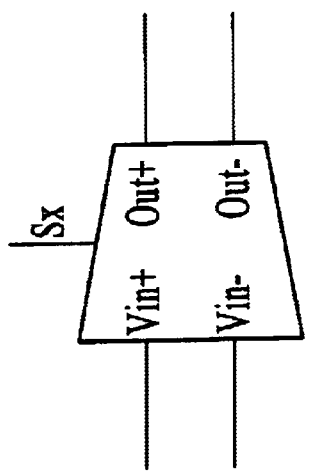
FIG. 5 is a simplified block diagram of the transconductor in accordance with the present invention.
Figure 6:
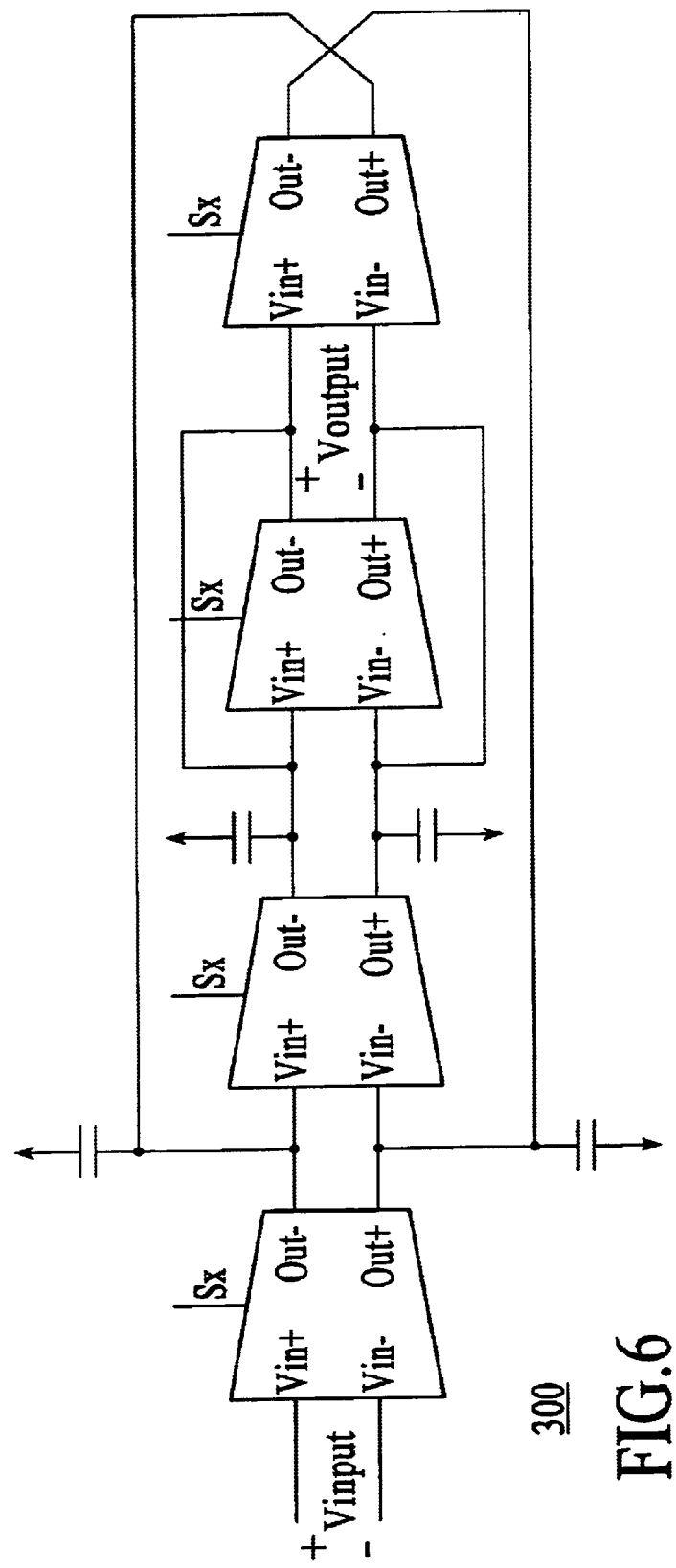
FIG. 6 is a detailed diagram of a second order low pass filter which includes a plurality of transconductors as shown in FIG. 5.
Figure 7:
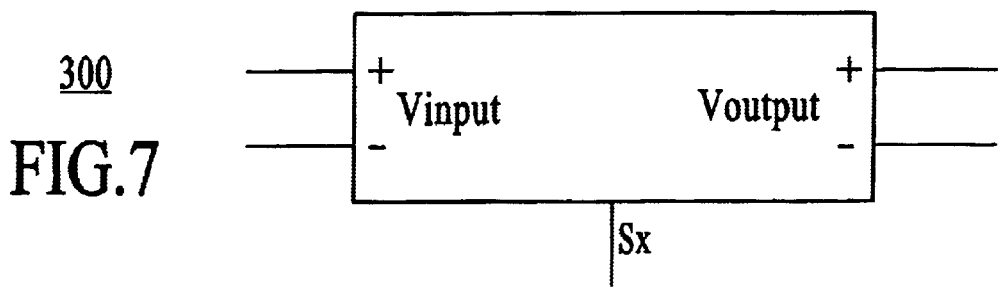
FIG. 7 illustrates a simplified diagram of the filter which includes one signal Sx that controls the offset of the transconductors located therein.

FIG. 5 is a simplified block diagram of the transconductor 202' in accordance with the present invention. As is seen, the signal Sx is the signal that controls one of the currents Idc1 or Idc2 that suppresses the even order harmonic by adjusting for the mismatch between the transistors therein. FIG. 6 is a detailed diagram of a second order low pass filter 300 which includes a plurality of transconductors as shown. As is seen, each of the transconductors includes the control signal Sx. Finally, FIG. 7 illustrates a simplified diagram of the filter 300 which includes one signal Sx that controls all of the currents Idc1 or Idc2 of the transconductors located therein. Accordingly, through the use of the control signal (Sx) for minimizing transconductor offset the even order harmonics can be suppressed.

Figure 8:
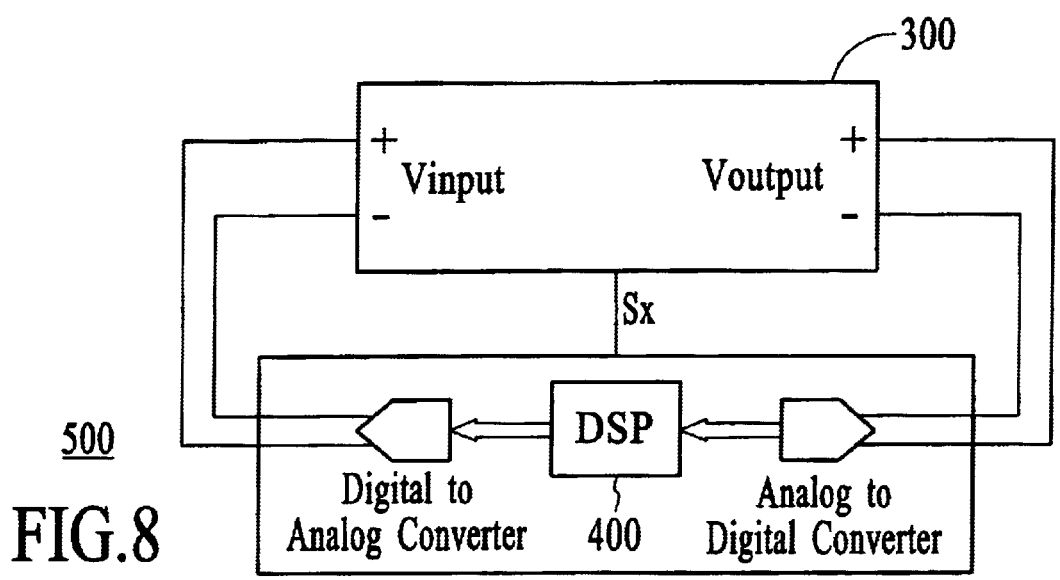
FIG. 8 illustrates a system for suppressing the even order harmonics in accordance with the present invention.
Figure 9:
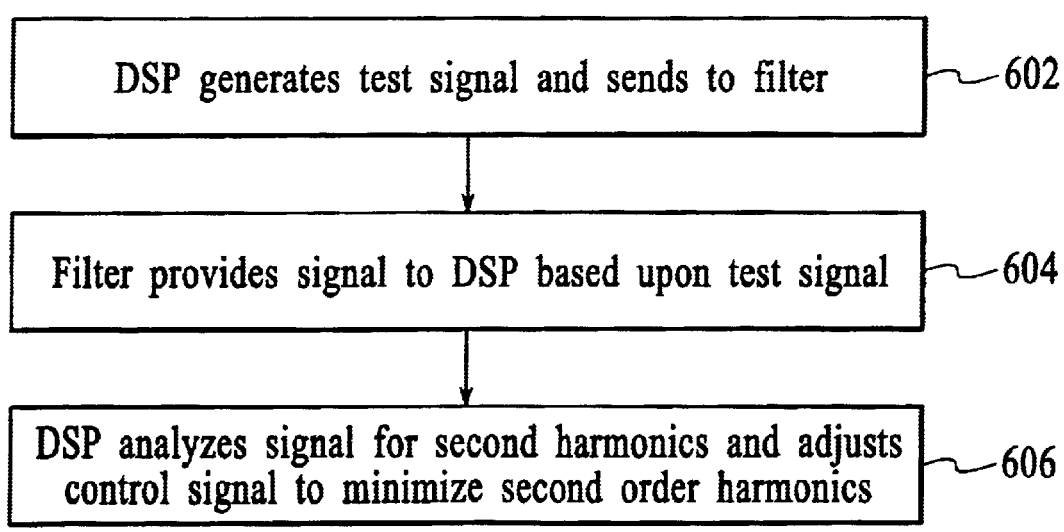
FIG. 9 is a flow chart of a method for calibrating the filter to suppress the even order harmonics in accordance with the present invention.

FIG. 8 illustrates a system 500 for suppressing the even order harmonics in accordance with the present invention. The system includes a digital signal processor (DSP) 400 which is coupled between the inputs and output of the filter 300 and also is coupled to the filter 300 via the control signal. FIG. 9 is a flow chart of a method for calibrating the filter to suppress the even order harmonics in accordance with the present invention.

Referring to FIGS. 8 and 9 together, first a test signal is generated by the DSP 400 and sent to the filter 300, via step 602. The filter 300 provides a signal to the DSP 400 based upon the test signal, via step 604. The DSP analyzes the signal for even order harmonics and adjusts the control signal to minimize the even order harmonics, via step 606.

Accordingly, by adjusting the source-followers currents the even order harmonics can be suppressed. In so doing the performance of a device such as a second order filter is significantly improved. By adding a small number transistors the mismatch-induced even order harmonics can be greatly reduced. The additional devices for the offset correction are the source followers in FIG. 4. Even-order harmonics are minimized through the application of a control voltage. A method for calibrating against transistor mismatch utilizing a CMOS transconductor that is based on the regulated cascode topology is disclosed. The method is designed to provide suppression of the even-order harmonics, a very small increase in power and a silicon area of the transconductor cell.

Although the present invention has been described in accordance with the embodiments shown, one of ordinary skill in the art will readily recognize that there could be variations to the embodiments and those variations would be within the spirit and scope of the present invention. For example, even though the present invention has been described in the context of a second order low pass filter, one of ordinary skill in the art recognizes that the present invention could be utilized in a variety of circuits and that use would be within the spirit and scope of the present invention. The key feature is that the circuit has transconductors that reduce even order harmonics due to transistor mismatch. Accordingly, many modifications may be made by one of ordinary skill in the art without departing from the spirit and scope of the appended claims.

What is claimed is:

1. A method for calibrating a device, the device comprising a plurality of transconductor cells, the method comprising the steps of:

(a) generating a test signal to the device; and (b) suppressing even-order harmonics due to transistor mismatches within the plurality of transconductor cells, wherein the suppressing step (b) comprises the step of (b1) introducing an offset voltage on an amplifier in the plurality of transconductor cells that controls the drain to source voltage of the input transistors of the cells.

2. The method of claim 1, wherein the offset voltage is controlled by a DSP in order to minimize the even order harmonics upon the application of the test signal on the device.

3. The method of claim 1 wherein the device comprises a second order low pass filter.

4. The method of claim 1 wherein the test signal comprises a sinusoidal test signal.

5. A calibration system comprising a device, the device including a plurality of transconductor cells; and a digital signal processor (DSP), the DSP for generating a test signal to the device and for suppressing even order harmonics due to transistor mismatches within the plurality of transconductor cells, wherein the DSP introduces an offset voltage to each amplifier in a plurality of transconductor cells that control the drain to source voltage of the input transistors of the cells.

6. The system of claim 5 wherein the device comprises a second order low pass filter.

7. The system of claim 5 wherein the DSP controls the offset voltage in order to minimize the even order harmonics upon the application of the test signal on the device.

8. The system of claim 5 wherein the test signal comprises a sinusoidal test signal.

* * * * *

UNITED STATES PATENT AND TRADEMARK OFFICE
CERTIFICATE OF CORRECTION

PATENT NO. : 6,909,292 B1  
APPLICATION NO. : 10/621767  
DATED : June 21, 2005  
INVENTOR(S) : Spyros Kavadias Page 1 of 1

It is certified that error appears in the above-identified patent and that said Letters Patent is hereby corrected as shown below:

On the cover page, item [75] after Spyros Kavadias, add the following inventor:

"Theodore Georgantas, Athens (GR)"

Signed and Sealed this

Fifteenth Day of December, 2009

David J. Kappos  
*Director of the United States Patent and Trademark Office*